(12) United States Patent
    Song et al.

(10) Patent No.: US 12,633,356 B2
(45) Date of Patent: \*May 19, 2026

(54) METHOD AND MEMORY USED FOR REDUCING PROGRAM DISTURBANCE BY ADJUSTING VOLTAGE OF DUMMY WORD LINE

(71) Applicant: YANGTZE MEMORY TECHNOLOGIES CO., LTD., Wuhan (CN)

(72) Inventors: Yali Song, Wuhan (CN); Jianquan Jia, Wuhan (CN); Kaikai You, Wuhan (CN); An Zhang, Wuhan (CN); XiangNan Zhao, Wuhan (CN); Ying Cui, Wuhan (CN); Shan Li, Wuhan (CN); Kaiwei Li, Wuhan (CN); Lei Jin, Wuhan (CN); Xueqing Huang, Wuhan (CN); Meng Lou, Wuhan (CN); Jinlong Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 147 days.

This patent is subject to a terminal disclaimer.

(21) Appl. No.: 18/385,642

(22) Filed: Oct. 31, 2023

(65) Prior Publication Data

US 2024/0062837 A1 Feb. 22, 2024

Related U.S. Application Data

(63) Continuation of application No. 18/118,565, filed on Mar. 7, 2023, now Pat. No. 11,848,058, which is a
(Continued)

(51) Int. Cl.
    *G11C 16/04* (2006.01)
    *G11C 16/34* (2006.01)
    (Continued)

(52) U.S. Cl.
    CPC ...... *G11C 16/3427* (2013.01); *G11C 16/0483* (2013.01); *H10B 41/27* (2023.02); *H10B 43/27* (2023.02)

(58) Field of Classification Search
    CPC ............ G11C 16/3427; G11C 16/0483; G11C 11/5628; G11C 16/08; G11C 16/3431; H10B 41/27; H10B 43/27
    (Continued)

(56) References Cited

U.S. PATENT DOCUMENTS 8,278,170 B2 * 10/2012 Lee .......................... H10B 41/20
                                                                438/266
8,488,386 B2 * 7/2013 Kim ........................ G11C 16/28
                                                                365/210.1
(Continued)

FOREIGN PATENT DOCUMENTS

CN         102810332 A    12/2012
CN         104143358 A    11/2014
            (Continued)

*Primary Examiner* — Tha-O H Bui
(74) *Attorney, Agent, or Firm* — BAYES PLLC

(57) ABSTRACT

A method for operating a memory device is provided. The memory device includes a first word line, a second word line, a first dummy word line, and a second dummy word line. The first dummy word line and the second dummy word line are between the first word line and the second word line. A first pass voltage is applied to the first dummy word line in a program operation. A second pass voltage is applied to the second dummy word line in the program operation. The first pass voltage is different from the second pass voltage.

19 Claims, 14 Drawing Sheets

Related U.S. Application Data continuation of application No. 17/187,651, filed on Feb. 26, 2021, now Pat. No. 11,626,170, which is a continuation of application No. 16/799,806, filed on Feb. 24, 2020, now Pat. No. 10,991,438, which is a continuation of application No. PCT/CN2019/123978, filed on Dec. 9, 2019.

(51) Int. Cl.
*H10B 41/27* (2023.01)
*H10B 43/27* (2023.01)

(58) Field of Classification Search
USPC ...................................................... 365/185.18
See application file for complete search history.

(56) References Cited

U.S. PATENT DOCUMENTS

| | | | |
|---|---|---|---|
| 9,496,038 | B1 | 11/2016 | Kwak et al. |
| 9,812,206 | B2 | 11/2017 | Nam et al. |
| 10,276,250 | B1 | 4/2019 | Chen et al. |
| 10,297,323 | B2 | 5/2019 | Yu et al. |
| 10,726,920 | B2 * | 7/2020 | Yang ................... G11C 16/0466 |
| 11,004,514 | B2 * | 5/2021 | Yamabe ................. G11C 16/10 |
| 11,521,687 | B2 * | 12/2022 | Yamabe ................. G11C 16/26 |
| 2006/0139997 | A1 | 6/2006 | Park et al. |
| 2009/0003067 | A1 | 1/2009 | Kang et al. |
| 2009/0135656 | A1 | 5/2009 | Park |
| 2012/0307561 | A1 | 12/2012 | Joo et al. |
| 2013/0107629 | A1 | 5/2013 | Shim et al. |
| 2014/0098612 | A1 | 4/2014 | Hosono et al. |
| 2015/0294724 | A1 | 10/2015 | Nam et al. |
| 2016/0012905 | A1 | 1/2016 | Chang et al. |
| 2016/0343450 | A1 | 11/2016 | Lee et al. |
| 2017/0062417 | A1 | 3/2017 | Chun |
| 2018/0019258 | A1 | 1/2018 | Lee et al. |
| 2018/0053554 | A1 | 2/2018 | Nam et al. |
| 2019/0156897 | A1 | 5/2019 | Lee et al. |
| 2019/0156901 | A1 | 5/2019 | Chen et al. |
| 2019/0198117 | A1 | 6/2019 | Yu et al. |
| 2019/0244673 | A1 | 8/2019 | Yang et al. |

FOREIGN PATENT DOCUMENTS

| | | |
|---|---|---|
| CN | 105280224 A | 1/2016 |
| CN | 106169307 A | 11/2016 |
| CN | 109961820 A | 7/2019 |

* cited by examiner

200

Adjust a first upper bias voltage
applied to the first upper dummy
word line and/or a first upper
threshold voltage of the first upper
dummy word line to adjust a first
difference between the first upper
bias voltage and the first upper
threshold voltage

210

Adjust a first lower bias voltage
applied to the first lower dummy
word line and/or a first lower
threshold voltage of the first lower
dummy word line to adjust a second
difference between the first lower
bias voltage and the first lower
threshold voltage

IDMY_u0

IDMY_l0
IDMY_l1

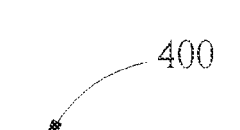

400

Adjust a first upper bias voltage applied to the first upper dummy word line and/or a first upper threshold voltage of the first upper dummy word line to adjust a first difference between the first upper bias voltage and the first upper threshold voltage — 210

Adjust a first lower bias voltage applied to the first lower dummy word line and/or a first lower threshold voltage of the first lower dummy word line to adjust a second difference between the first lower bias voltage and the first lower threshold voltage — 220

Adjusting a second lower bias voltage applied to the second lower dummy word line and/or a second lower threshold voltage of the second lower dummy word line to adjust a third difference between the second lower bias voltage and the second lower threshold voltage — 230

FIG. 4

600

Adjust a first upper bias voltage applied to the first upper dummy word line and/or a first upper threshold voltage of the first upper dummy word line to adjust a first difference between the first upper bias voltage and the first upper threshold voltage ～ 210

Adjust a first lower bias voltage applied to the first lower dummy word line and/or a first lower threshold voltage of the first lower dummy word line to adjust a second difference between the first lower bias voltage and the first lower threshold voltage ～ 220

Adjusting a second upper bias voltage applied to the second upper dummy word line and/or a second upper threshold voltage of the second upper dummy word line to adjust a fourth difference between the second upper bias voltage and the second upper threshold voltage ～ 240

FIG. 6

IDMY_u1

IDMY_u0

IDMY_l0

METHOD AND MEMORY USED FOR REDUCING PROGRAM DISTURBANCE BY ADJUSTING VOLTAGE OF DUMMY WORD LINE

CROSS REFERENCE TO RELATED APPLICATIONS

This application is a continuation of U.S. application Ser. No. 18/118,565, filed on Mar. 7, 2023, issued as U.S. Pat. No. 11,848,058, which is a continuation of U.S. application Ser. No. 17/187,651, filed on Feb. 26, 2021, issued as U.S. Pat. No. 11,626,170, which is a continuation of U.S. application Ser. No. 16/799,806, filed on Feb. 24, 2020, issued as U.S. Pat. No. 10,991,438, which is a continuation of International Application No. PCT/CN2019/123978, filed Dec. 9, 2019, all of which are incorporated herein by reference in their entireties.

BACKGROUND

The disclosure is related to a method and a memory for reducing program disturbance, and more particularly, a method and a memory for reducing program disturbance by adjusting voltage of a dummy word line.

In order to increase the capacity of a memory, a memory with a three-dimensional structure has been developed. For example, a three-dimensional stack NAND flash memory can be available presently.

A three-dimensional structure of a memory can include a plurality of layers so as to store more data on a same area. This solution has been proved to be effective for increasing capacity of memory.

However, the program disturbance will become more serious when the number of layers is increased. Program disturbance will lead to a higher failure rate of programming a memory. Hence, a solution for reducing program disturbance when operating a three-dimensional memory is in need in the field.

SUMMARY

An embodiment discloses a method for reducing program disturbance of a memory. The memory includes an upper deck and a lower deck. The upper deck includes a first upper dummy word line. The lower deck includes a first lower dummy word line. The method includes adjusting a first upper bias voltage applied to the first upper dummy word line and/or a first upper threshold voltage of the first upper dummy word line to adjust a first difference between the first upper bias voltage and the first upper threshold voltage; and adjusting a first lower bias voltage applied to the first lower dummy word line and/or a first lower threshold voltage of the first lower dummy word line to adjust a second difference between the first lower bias voltage and the first lower threshold voltage.

Another embodiment includes a memory for reducing program disturbance. The memory includes an upper deck and a lower deck. The upper deck includes a first upper dummy word line configured to receive a first upper bias voltage and have a first upper threshold voltage. The lower deck includes a first lower dummy word line configured to receive a first lower bias voltage and have a first lower threshold voltage. The first upper bias voltage and/or the first upper threshold voltage is adjusted to adjust a first difference between the first upper bias voltage and the first upper threshold voltage. The first lower bias voltage and/or the first lower threshold voltage is adjusted to adjust a second difference between the first lower bias voltage and the first lower threshold voltage.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a flowchart of a method for reducing program disturbance of the memory of FIG. 1.

FIG. 4 is a flowchart of a method for reducing program disturbance of the memory of FIG. 3.

FIG. 6 is a flowchart of a method for reducing program disturbance of the memory of FIG. 5.

DETAILED DESCRIPTION

In the text, when an item A and an item B are connected with the conjunction "and/or" to be "A and/or B", it indicates A, B or both of A and B.

Figure 1:
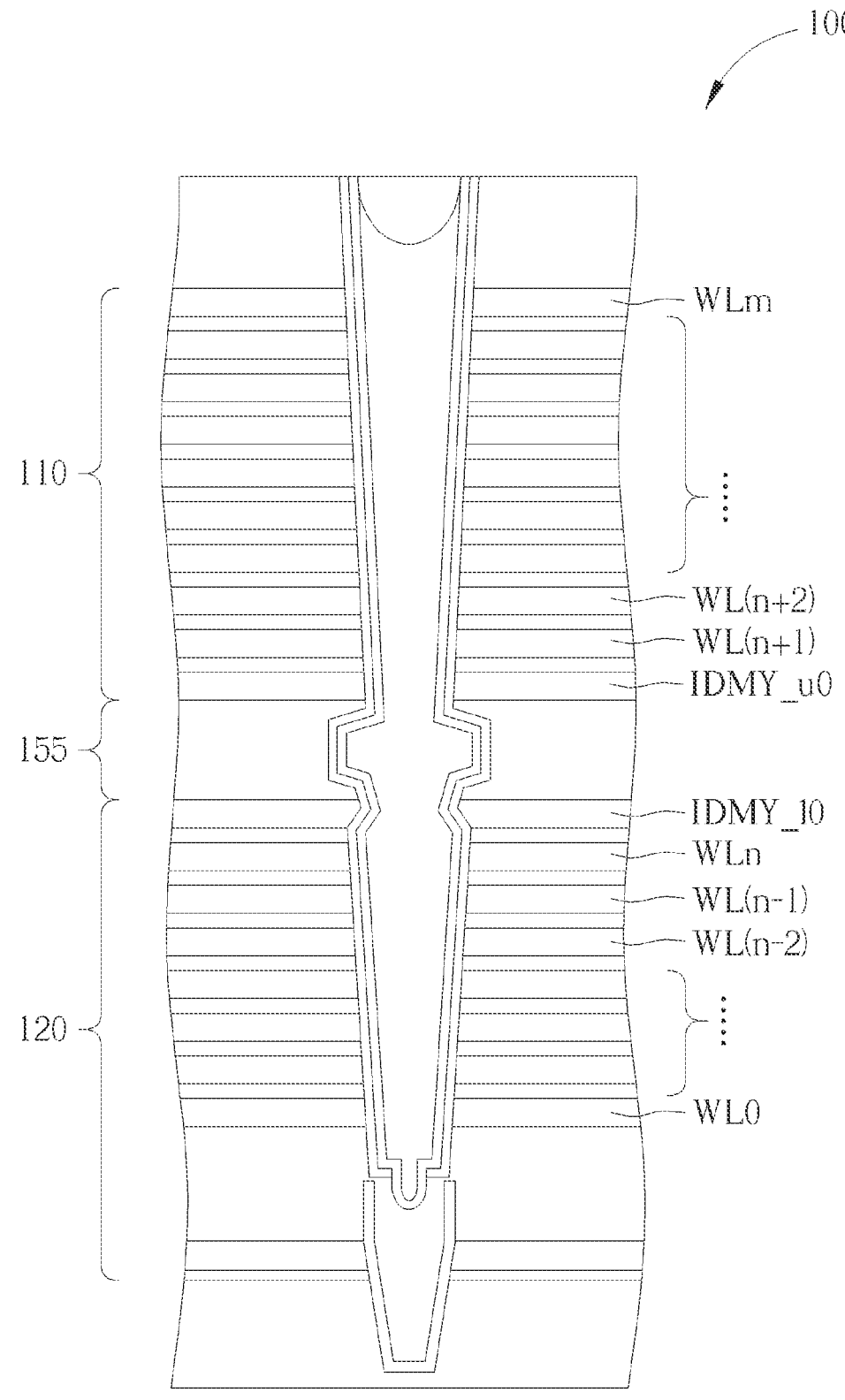
FIG. 1 illustrates a memory according to an embodiment.

FIG. 1 illustrates a memory 100 according to an embodiment. The memory 100 may include an upper deck 110 and a lower deck 120. The upper deck 110 may be formed above the lower deck 120. The memory 100 may further include a joint oxide layer 155 formed between the upper deck 110 and the lower deck 120.

As shown in FIG. 1, the upper deck 110 may include a first upper dummy word line IDMY_u0, and the lower deck 120 may include a first lower dummy word line IDMY_l0.

FIG. 2 is a flowchart of a method 200 for reducing program disturbance of the memory 100 of FIG. 1. The method 200 includes following steps.

Step 210: adjust a first upper bias voltage V_u0 applied to the first upper dummy word line IDMY_u0 and/or a first upper threshold voltage Vt_u0 of the first upper dummy word line IDMY_u0 to adjust a first difference $\Delta V\_u0$ between the first upper bias voltage V_u0 and the first upper threshold voltage Vt_u0; and Step 220: adjust a first lower bias voltage V_l0 applied to the first lower dummy word line IDMY_l0 and/or a first lower threshold voltage Vt_l0 of the first lower dummy word line IDMY_l0 to adjust a second difference $\Delta V\_l0$ between the first lower bias voltage V_l0 and the first lower threshold voltage Vt_l0.

FIG. 2 is merely an example, and the steps in FIG. 2 may be performed in any sequence. For example, Step 220 may be performed first. The steps may be performed concurrently.

$\Delta$V_u0 and $\Delta$V_l0 in Step 210 and 220 may be expressed as the following equations:

$$\Delta V\_u0 = V\_u0 - Vt\_u0 \qquad \text{(eq-1); and}$$

$$\Delta V\_l0 = V\_l0 - Vt\_l0 \qquad \text{(eq-2).}$$

As described in Step 210 and Step 220, V_u0 and/or Vt_u0 may be adjusted to adjust $\Delta$V_u0. V_l0 and/or Vt_l0 may be adjusted to adjust $\Delta$V_l0. By adjusting the first difference $\Delta$V_u0 and the second difference $\Delta$V_l0 as below, program disturbance may be reduced.

As shown in FIG. 1, a word line WLn may be at the first layer below the first lower dummy word line IDMY_l0. A word line WL(n−1) may be at the second layer below the first lower dummy word line IDMY_l0. Word lines WL(n−2) to WL0 may be at layers below the layer of the word line WL(n−1).

A word line WL(n+1) may be at the first layer above the first upper dummy word line IDMY_u0. A word line WL(n+2) may be at the second layer above the first upper dummy word line IDMY_u0. Word lines WL(n+3) to WLm may be at layers above the layer of the word line WL(n+2).

Regarding the adjustment of the first difference $\Delta$V_u0 and the second difference $\Delta$V_l0, when programming a word line of the word lines WL(n−1) to WL(n+2), the first difference $\Delta$V_u0 may be adjusted to be higher than a threshold TH1. The second difference $\Delta$V_l0 may be adjusted to be higher than the threshold TH1. In other words, after the adjustment, $\Delta$V_u0=V_u0−Vt_u0>TH1, and $\Delta$V_l0=V_l0−Vt_l0>TH1. For example, the threshold TH1 may be 7 volts.

When programming a word line of the word lines WL(n+3) to WLm, the first difference $\Delta$V_u0 may be adjusted to be lower than a threshold TH2. The second difference $\Delta$V_l0 may be adjusted to be lower than the threshold TH2. In other words, after the adjustment, $\Delta$V_u0=V_u0−Vt_u0<TH2, and $\Delta$V_l0=V_l0−Vt_l0<TH2. For example, the threshold TH2 may be 7 volts.

When programming a word line of the word lines WL0 to WL(n−2), the first difference $\Delta$V_u0 and the second difference $\Delta$V_l0 may not be limited; however, according to experiments, the first difference $\Delta$V_u0 and the second difference $\Delta$V_l0 may be higher than a threshold TH3. For example, the threshold TH3 may be 3 volts.

Figure 3:
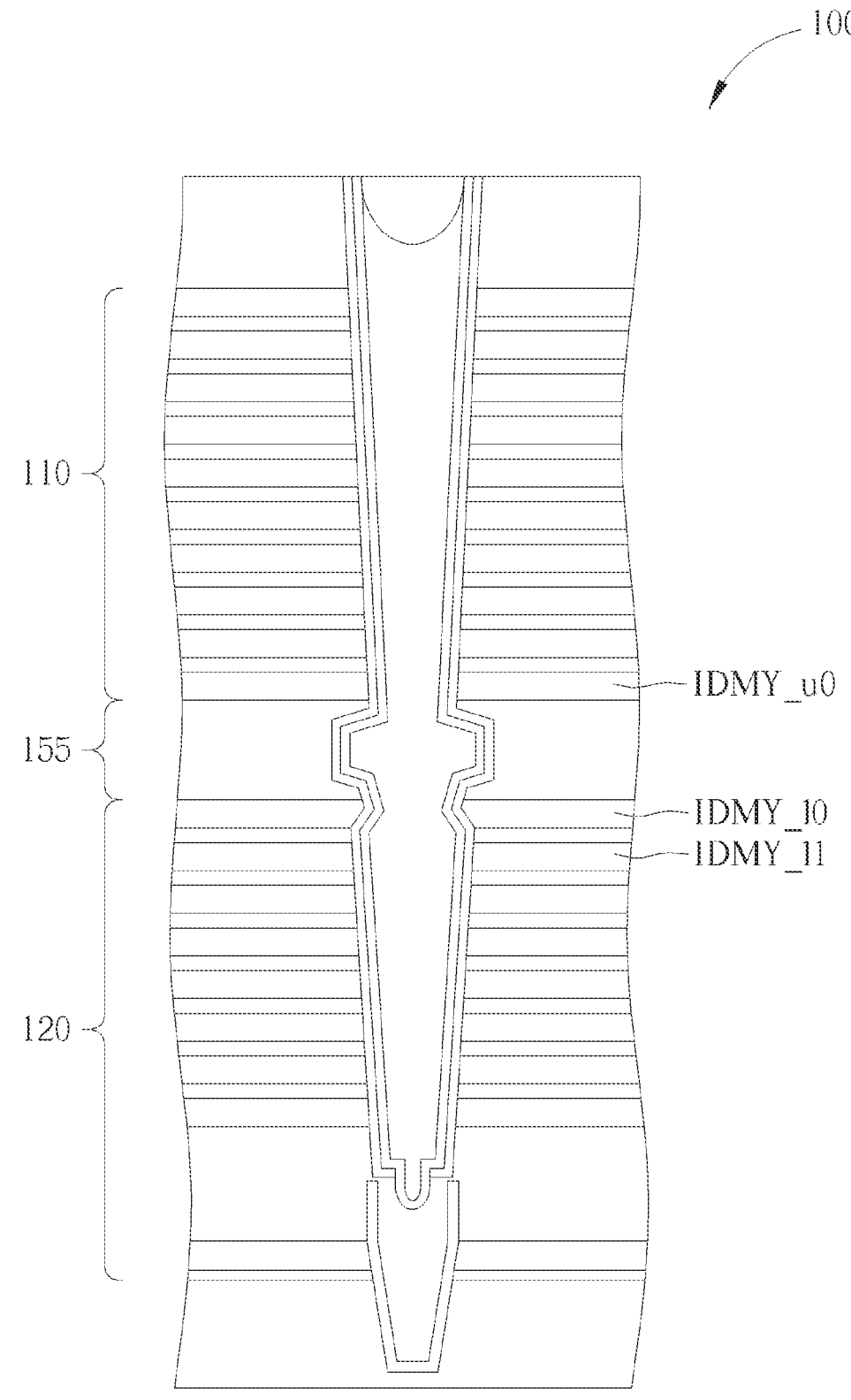
FIG. 3 illustrates a memory according to another embodiment.

FIG. 3 illustrates the memory 100 according to another embodiment. The structure shown in FIG. 3 may be similar to that shown in FIG. 1. As shown in FIG. 3, the lower deck 120 may further include a second lower dummy word line IDMY_l1.

FIG. 4 is a flowchart of a method 400 for reducing program disturbance of the memory 100 of FIG. 3. The method 400 may include following steps.

Step 210: adjust a first upper bias voltage V_u0 applied to the first upper dummy word line IDMY_u0 and/or a first upper threshold voltage Vt_u0 of the first upper dummy word line IDMY_u0 to adjust a first difference $\Delta$V_u0 between the first upper bias voltage V_u0 and the first upper threshold voltage Vt_u0;

Step 220: adjust a first lower bias voltage V_l0 applied to the first lower dummy word line IDMY_l0 and/or a first lower threshold voltage Vt_l0 of the first lower dummy word line IDMY_l0 to adjust a second difference $\Delta$V_l0 between the first lower bias voltage V_l0 and the first lower threshold voltage Vt_l0; and Step 230: adjusting a second lower bias voltage V_l1 applied to the second lower dummy word line IDMY_l1 and/or a second lower threshold voltage Vt_l1 of the second lower dummy word line IDMY_l1 to adjust a third difference $\Delta$V_l1 between the second lower bias voltage V_l1 and the second lower threshold voltage Vt_l1.

FIG. 4 is merely an example, and the steps in FIG. 4 may be performed in any sequence. For example, Step 220 or Step 230 may be performed before Step 210. The steps may be performed concurrently.

$\Delta$V_u0 and $\Delta$V_l0 in Steps 210 and 220 may be expressed as the equations (eq-1) and (eq-2) above. $\Delta$V_l1 in Step 230 may be expressed as the following equation.

$$\Delta V\_l1 = V\_l1 - Vt\_l1 \qquad \text{(eq-3).}$$

As described in Step 210 to Step 230, the first difference $\Delta$V_u0, the second difference $\Delta$V_l0 and the third difference $\Delta$V_l1 may be adjusted as below to reduce program disturbance.

When programming a word line of the upper deck 110, the first difference $\Delta$V_u0 may be adjusted to be higher than a threshold TH4, the second difference $\Delta$V_l0 may be adjusted to be lower than the threshold TH4, and the third difference $\Delta$V_l1 may be adjusted to be lower than the threshold TH4. In other words, after the adjustment, $\Delta$V_u0=V_u0−Vt_u0>TH4, $\Delta$V_l0=V_l0−Vt_l0<TH4, and $\Delta$V_l1=V_l1−Vt_l1<TH4. For example, the threshold TH4 may be 7 volts.

In addition, according to an embodiment, a condition (c−1) may also have to be met for reducing program disturbance of the memory 100 of FIG. 3.

The condition (c−1) may include that a difference between the first difference $\Delta$V_u0 and the second difference $\Delta$V_l0 may be within a predetermined range, and another difference between the first difference $\Delta$V_u0 and the third difference $\Delta$V_l1 may be within the predetermined range.

The predetermined range related to the condition (c−1) may be within a level L1 and a level L2 higher than the level L1. Hence, in other words, the condition (c−1) may be expressed as L1<($\Delta$V_u0−$\Delta$V_l0)<L2, and L1<($\Delta$V_u0−$\Delta$V_l1)<L2. For example, the level L1 may be 3 volts, and the second level L2 may be 7 volts.

Regarding FIG. 3, the equations and inequalities related to the first difference $\Delta$V_u0, the second difference $\Delta$V_l0 and the third difference $\Delta$V_l1 mentioned above may be applied when programming a word line of the upper deck 110.

When programming a word line of the lower deck 120, the first difference $\Delta$V_u0, the second difference $\Delta$V_l0 and the third difference $\Delta$V_l1 may not be limited; however, according to experiments, the differences $\Delta$V_u0, $\Delta$V_l0 and $\Delta$V_l1 may be higher than a threshold such as 3 volts.

Figure 5:
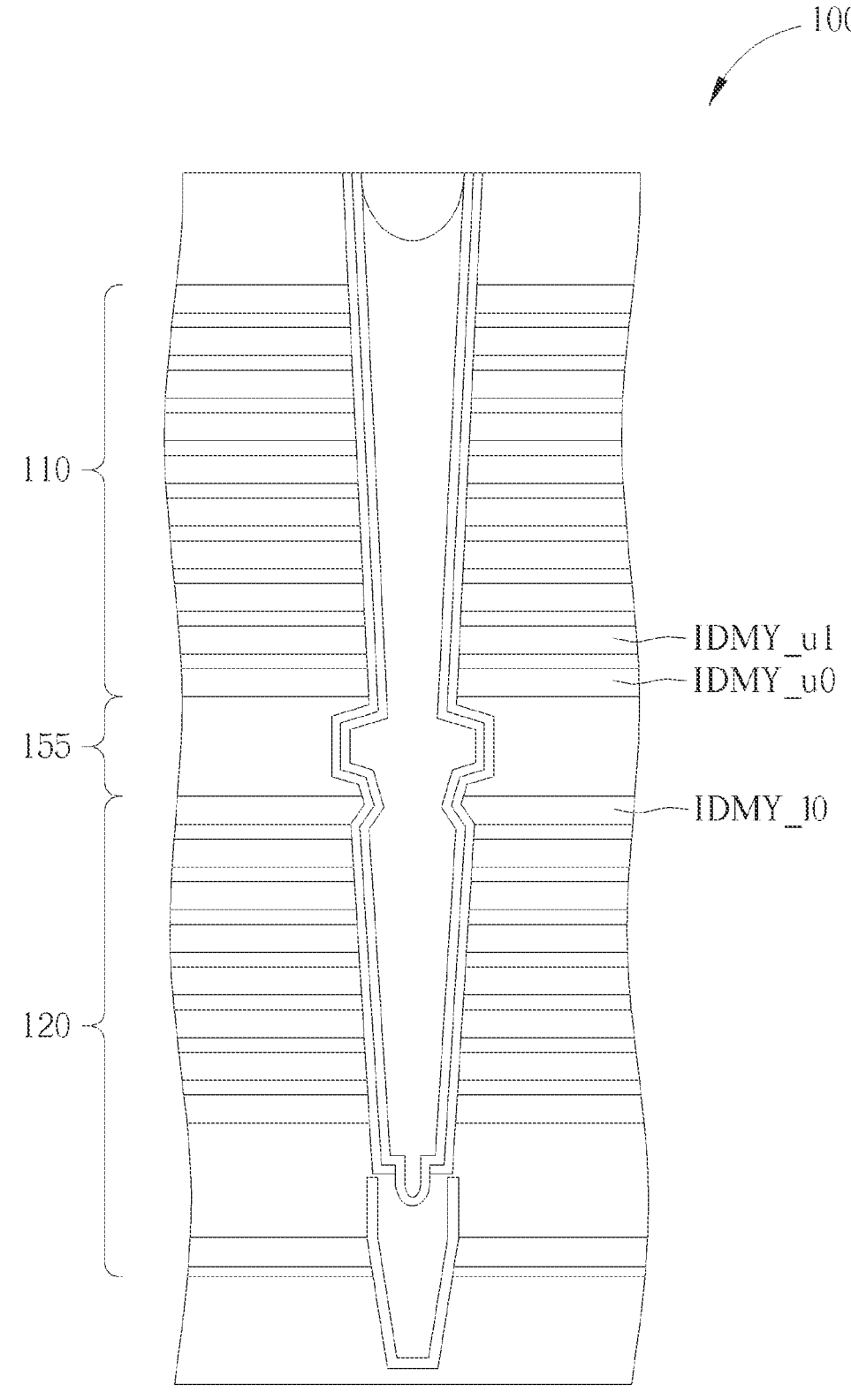
FIG. 5 illustrates a memory according to another embodiment.

FIG. 5 illustrates the memory 100 according to another embodiment. The structure shown in FIG. 5 may be similar to that shown in FIG. 1. As shown in FIG. 5, the upper deck 110 may further include a second upper dummy word line IDMY_u1.

FIG. 6 is a flowchart of a method 600 for reducing program disturbance of the memory 100 of FIG. 5. The method 600 may include following steps.

Step 210: adjust a first upper bias voltage V_u0 applied to the first upper dummy word line IDMY_u0 and/or a first upper threshold voltage Vt_u0 of the first upper dummy word line IDMY_u0 to adjust a first difference $\Delta$V_u0 between the first upper bias voltage V_u0 and the first upper threshold voltage Vt_u0;

Step 220: adjust a first lower bias voltage V_l0 applied to the first lower dummy word line IDMY_l0 and/or a first lower threshold voltage Vt_l0 of the first lower dummy word line IDMY_l0 to adjust a second difference $\Delta$V_l0 between the first lower bias voltage V_l0 and the first lower threshold voltage Vt_l0; and Step 240: adjusting a second upper bias voltage V_u1 applied to the second upper dummy word line IDMY_u1 and/or a second upper threshold voltage Vt_u1 of the second upper dummy word line IDMY_u1 to adjust a fourth difference ΔV_u1 between the second upper bias voltage V_u1 and the second upper threshold voltage Vt_u1.

FIG. 6 is merely an example, and the steps in FIG. 6 may be performed in any sequence. For example, Step 220 or Step 240 may be performed before Step 210. The steps may be performed concurrently.

ΔV_u0 and ΔV_l0 in Step 210 and 220 may be expressed as the equations (eq-1) and (eq-2) above. ΔV_u1 in Step 240 may be expressed as the following equation.

$$\Delta V\_u1 = V\_u1 - Vt\_u1 \qquad \text{(eq-4)}.$$

As described in Step 210, Step 220 and Step 230, the first difference ΔV_u0, the second difference ΔV_l0 and the fourth difference ΔV_u1 may be adjusted as below to reduce program disturbance.

When programming a word line of the upper deck 110, the first difference ΔV_u0 may be adjusted to be lower than a threshold TH5, the second difference ΔV_l0 may be adjusted to be lower than the threshold TH5, and the fourth difference ΔV_u1 may be adjusted to be higher than the threshold TH5. In other words, after the adjustment, ΔV_u0=V_u0−Vt_u0<TH5, ΔV_l0=V_l0−Vt_l0<TH5, and ΔV_u1=V_u1−Vt_u1>TH5. For example, the threshold TH5 may be 7 volts.

In addition, according to an embodiment, a condition (c−2) may also have to be met for reducing program disturbance of the memory 100 of FIG. 5.

The condition (c−2) may include that a difference between the fourth difference ΔV_u1 and the first difference ΔV_u0 may be within a predetermined range, and another difference between the fourth difference ΔV_u1 and the second difference ΔV_l0 may be within the predetermined range.

The predetermined range related to the condition (c−2) may be within a level L3 and a level L4 higher than the level L3. Hence, in other words, the condition (c−2) may be expressed as L3<(ΔV_u1−ΔV_u0)<L4, and L3<(ΔV_u1−ΔV_l0)<L4. For example, the level L3 may be 3 volts, and the level L4 may be 7 volts.

Regarding FIG. 5, the equations and inequalities related to the differences ΔV_u0, ΔV_l0 and ΔV_u1 mentioned above may be applied when programming a word line of the upper deck 110.

When programming a word line of the lower deck 120, the differences ΔV_u0, ΔV_l0 and ΔV_u1 may not be limited; however, according to experiments, the differences ΔV_u0, ΔV_l0 and ΔV_u1 may be higher than a threshold such as 3 volts.

Figure 7:
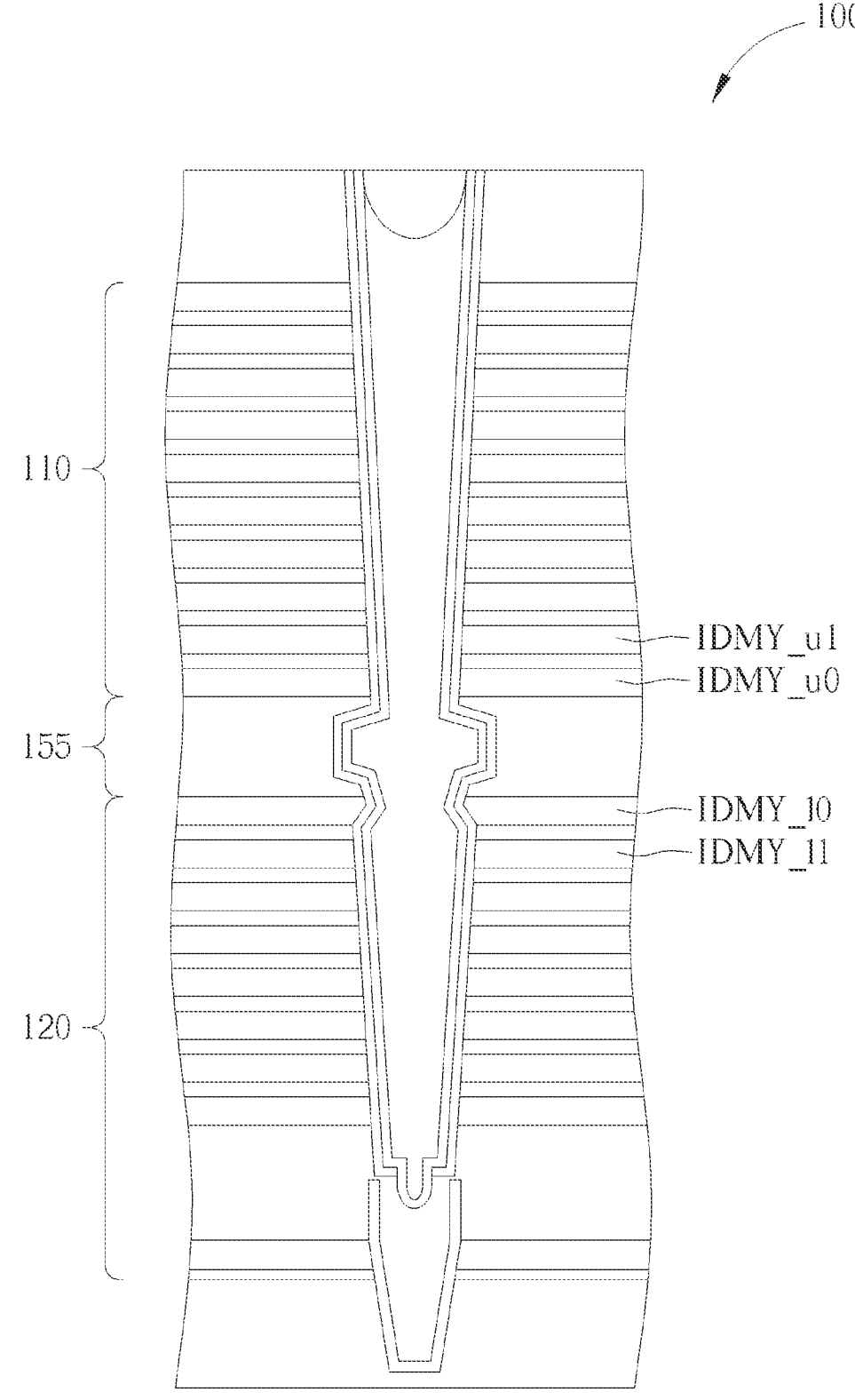
FIG. 7 illustrates a memory according to another embodiment.

FIG. 7 illustrates the memory 100 according to another embodiment. The structure shown in FIG. 7 may be similar to that shown in FIG. 1. Compared with FIG. 1, in FIG. 7, the upper deck 110 may further include the second upper dummy word line IDMY_u1, and the lower deck 120 may further include the second lower dummy word line IDMY_l1.

Figure 8:
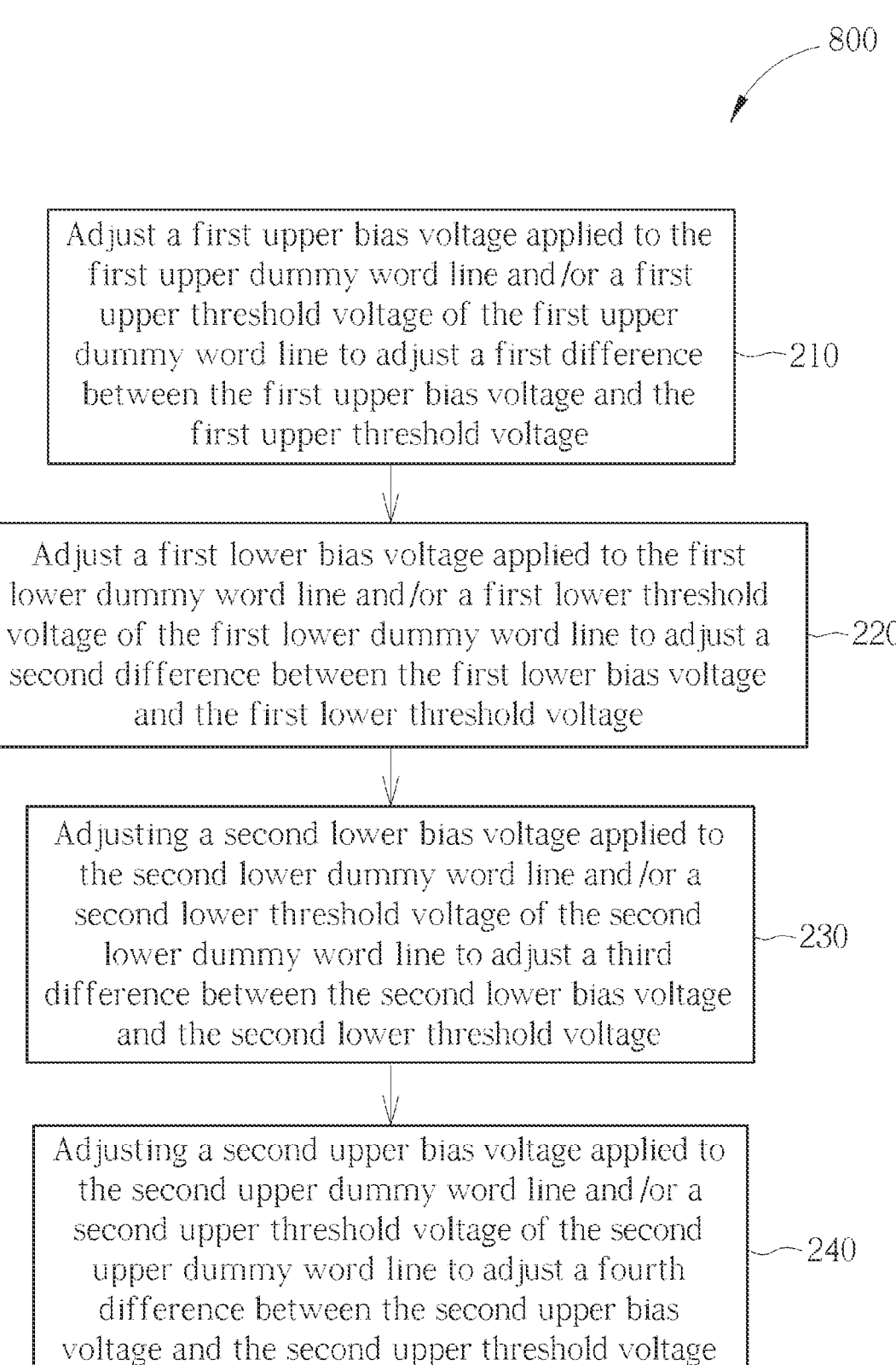
FIG. 8 is a flowchart of a method for reducing program disturbance of the memory of FIG. 7.

FIG. 8 is a flowchart of a method 800 for reducing program disturbance of the memory 100 of FIG. 7. The method 800 may include following steps.

Step 210: adjust a first upper bias voltage V_u0 applied to the first upper dummy word line IDMY_u0 and/or a first upper threshold voltage Vt_u0 of the first upper dummy word line IDMY_u0 to adjust a first difference ΔV_u0 between the first upper bias voltage V_u0 and the first upper threshold voltage Vt_u0;

Step 220: adjust a first lower bias voltage V_l0 applied to the first lower dummy word line IDMY_l0 and/or a first lower threshold voltage Vt_l0 of the first lower dummy word line IDMY_l0 to adjust a second difference ΔV_l0 between the first lower bias voltage V_l0 and the first lower threshold voltage Vt_l0;

Step 230: adjusting a second lower bias voltage V_l1 applied to the second lower dummy word line IDMY_l1 and/or a second lower threshold voltage Vt_l1 of the second lower dummy word line IDMY_l1 to adjust a third difference ΔV_l1 between the second lower bias voltage V_l1 and the second lower threshold voltage Vt_l1; and Step 240: adjusting a second upper bias voltage V_u1 applied to the second upper dummy word line IDMY_u1 and/or a second upper threshold voltage Vt_u1 of the second upper dummy word line IDMY_u1 to adjust a fourth difference ΔV_u1 between the second upper bias voltage V_u1 and the second upper threshold voltage Vt_u1.

FIG. 8 is merely an example, and the steps in FIG. 8 may be performed in any sequence. For example, Step 220, Step 230 or Step 240 may be performed before Step 210. The steps may be performed concurrently.

ΔV_u0, ΔV_l0, ΔV_l1 and ΔV_u1 in Step 210 to Step 240 may be expressed as the equations (eq-1) to (eq-4) described above.

As described in Step 210 to Step 240, the first difference ΔV_u0, the second difference ΔV_l0, the third difference ΔV_l1 and the fourth difference ΔV_u1 may be adjusted as below to reduce program disturbance.

When programming a word line of the upper deck 110, the first difference ΔV_u0 may be adjusted to be lower than a threshold TH11. The second difference ΔV_l0 may be adjusted to be lower than a second threshold TH12. The third difference ΔV_l1 may be adjusted to be lower than the first threshold TH11. The fourth difference ΔV_u1 may be adjusted to be higher than the second threshold TH12. In other words, after the adjustment, ΔV_u0=V_u0−Vt_u0<TH11, ΔV_l0=V_l0−Vt_l0<TH12, ΔV_l1=V_l1−Vt_l1<TH11, and ΔV_u1=V_u1−Vt_u1>TH12. For example, the first threshold TH11 may be 11 volts, and the second threshold TH12 may be 7 volts.

In addition, according to an embodiment, one of a condition (c−3) and a condition (c−4) may also have to be met for reducing program disturbance of the memory 100 of FIG. 7.

The condition (c−3) may include that a difference between the fourth difference ΔV_u1 and the first difference ΔV_u0 may be within a predetermined range, and another difference between the fourth difference ΔV_u1 and the second difference ΔV_l0 may within the predetermined range.

The predetermined range related to the condition (c−3) may be within a level L5 and a level L6 higher than the level L5. Hence, in other words, the condition (c−3) may be expressed as L5<(ΔV_u1−ΔV_u0)<L6, and L5<(ΔV_u1−ΔV_l0)<L6. For example, the level L5 may be 3 volts, and the level L6 may be 7 volts.

The condition (c−4) may include that a difference between the fourth difference ΔV_u1 and the second difference ΔV_l0 may be within a predetermined range, and another difference between the fourth difference ΔV_u1 and the third difference ΔV_l1 may be within the predetermined range.

The predetermined range related to the condition (c–4) may be within a level L7 and a level L8 higher than the level L7. Hence, in other words, the condition (c–4) may be expressed as L7<($\Delta$V_u1–$\Delta$V_l0)<L8, and L7<($\Delta$V_u1–$\Delta$V_l1)<L8. For example, the level L7 may be 3 volts, and the level L8 may be 7 volts.

Regarding FIG. 7, the equations and inequalities related to the differences $\Delta$V_u0, $\Delta$V_l0, $\Delta$V_l1 and $\Delta$V_u1 mentioned above may be applied when programming a word line of the upper deck 110.

When programming a word line of the lower deck 120, the differences $\Delta$V_u0, $\Delta$V_l0, $\Delta$V_l1 and $\Delta$V_u1 may not be limited; however, according to experiments, the differences $\Delta$V_u0, $\Delta$V_l0, $\Delta$V_l1 and $\Delta$V_u1 may be higher than a threshold such as 3 volts.

Figure 9:
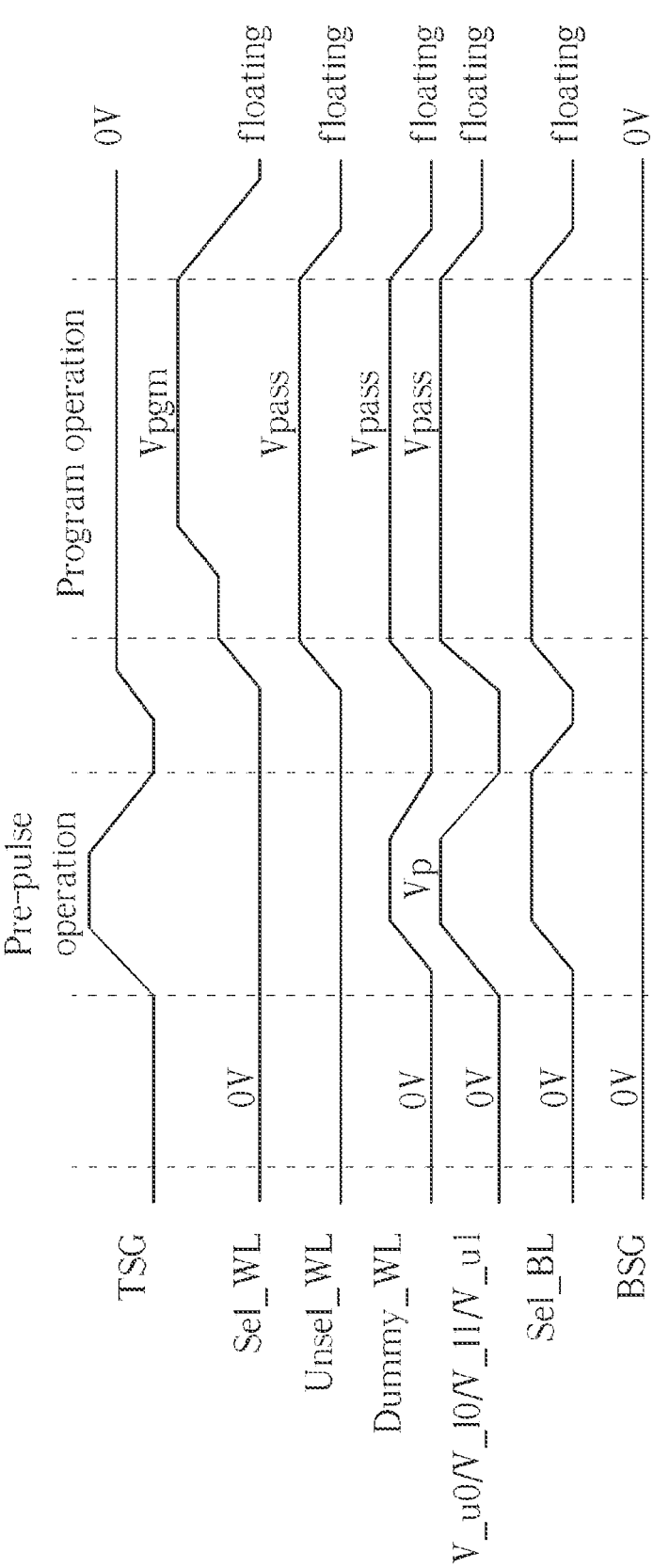
FIG. 9 is a waveform of controlling the memory of FIG. 7.

FIG. 9 is a waveform of controlling the memory 100 of FIG. 7. According to an embodiment, the memory 100 may further include a top select gate electrode (denoted as TSG), a select word line (denoted as Sel_WL), an unselect word line (denoted as Unsel_WL), a dummy word line (denoted as Dummy_WL), a select bit line (denoted as Sel_BL) and a bottom select gate electrode (denoted as BSG) used for controlling both of the upper deck 110 and the lower deck 120.

As shown in FIG. 9, before a program operation, a pre-pulse operation may be performed. The pre-pulse operation may be performed to avoid failure of the program operation.

As shown in FIG. 9, before the pre-pulse operation, 0 volts may be applied to the select word line (Sel_WL), the dummy word line (Dummy_WL), the select bit line (Sel_BL) and the bottom select gate electrode (BSG). The first upper bias voltage V_u0, the first lower bias voltage V_l0, the second lower bias voltage V_l1 and the second upper bias voltage V_u1 may be set as 0 volts.

The first upper bias voltage V_u0, the first lower bias voltage V_l0, the second lower bias voltage V_l1 and the second upper bias voltage V_u1 may be set to a pre-pulse level Vp during the pre-pulse operation. Then, the first upper bias voltage V_u0, the first lower bias voltage V_l0, the second lower bias voltage V_l1 and the second upper bias voltage V_u1 may be set to a program level Vpass during the program operation.

During the program operation, a voltage of the program level Vpass may be applied to the unselect word line (Unsel_WL) and the dummy word line (Dummy_WL). A voltage applied to the select word line (Sel_WL) may be increased to a level Vpgm.

As shown in FIG. 9, during the program operation, 0 volts may be applied to the top select gate electrode (TSG) and the bottom select gate electrode (BSG). After the program operation, the select word line (Sel_WL), the unselect word line (Unsel_WL), the dummy word line (Dummy_WL), the select bit line (Sel_BL) and the bias voltages V_u0, V_l0, V_l1 and V_u1 may be set as floating.

In FIG. 9, the pre-pulse level Vp may be higher than a maximum allowable level Vt_max of the first upper threshold voltage Vt_u0, the first lower threshold voltage Vt_l0, the second lower threshold voltage Vt_l1 and the second upper threshold voltage Vt_u1.

As FIG. 9, the bias voltages V_u0, V_l0, V_l1 and V_u1 may be supplied by the same voltage source to reduce the number of voltage sources.

Figure 10:
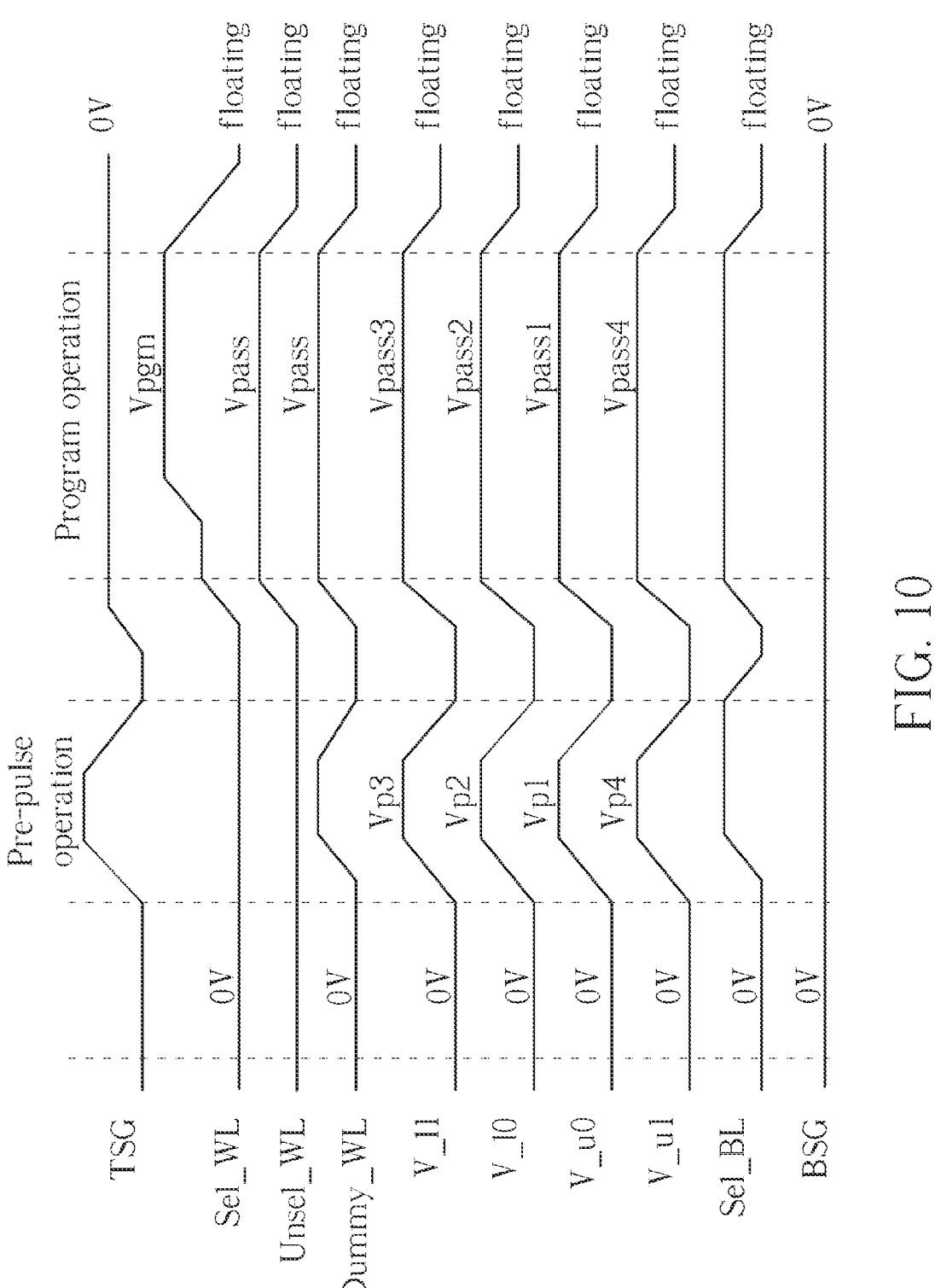
FIG. 10 is a waveform of controlling the memory of FIG. 7 according to another embodiment.
Figure 11:
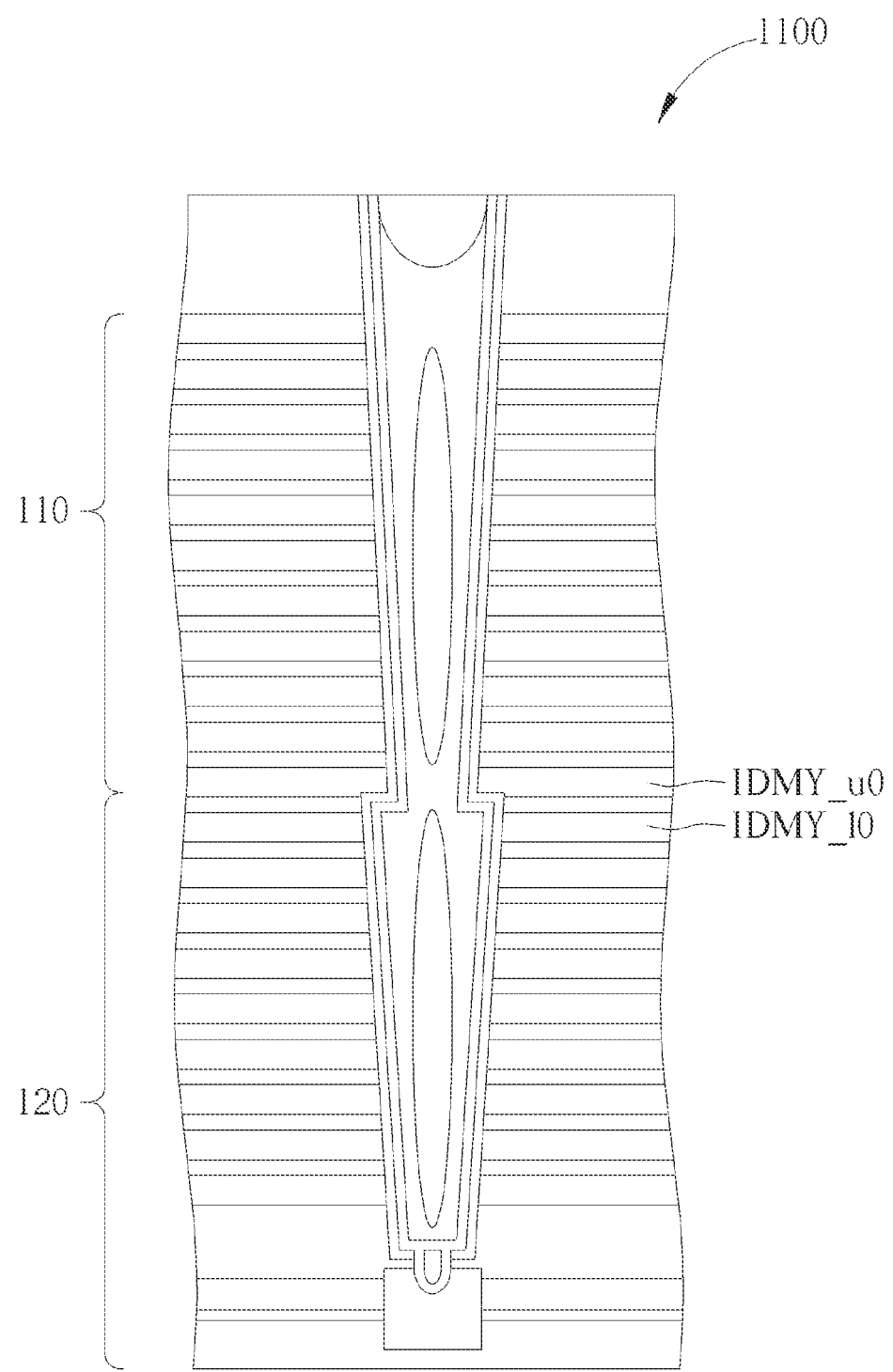
FIG. 11 to FIG. 14 illustrate a memory according to different embodiments.
Figure 12:
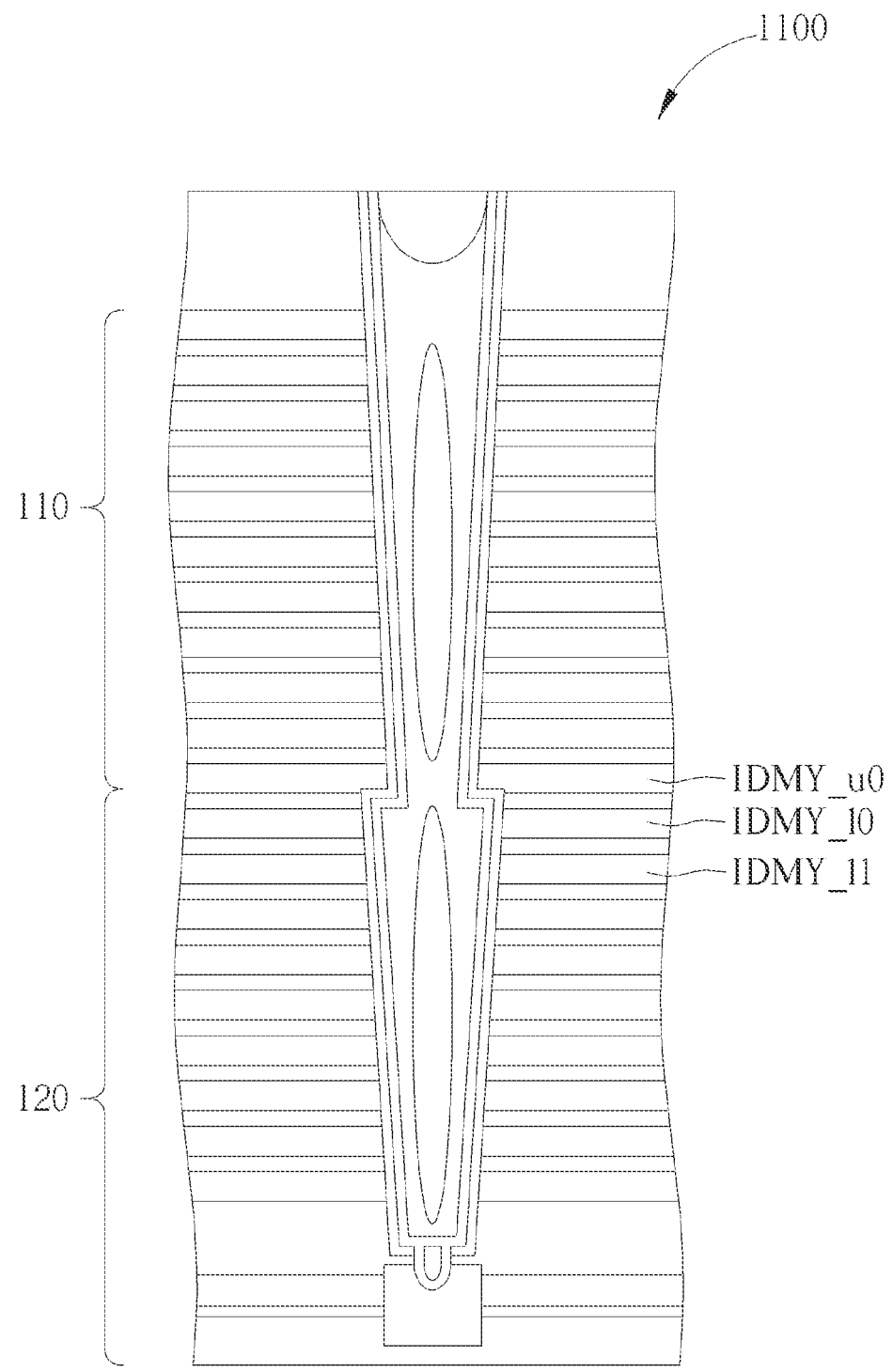
Figure 13:
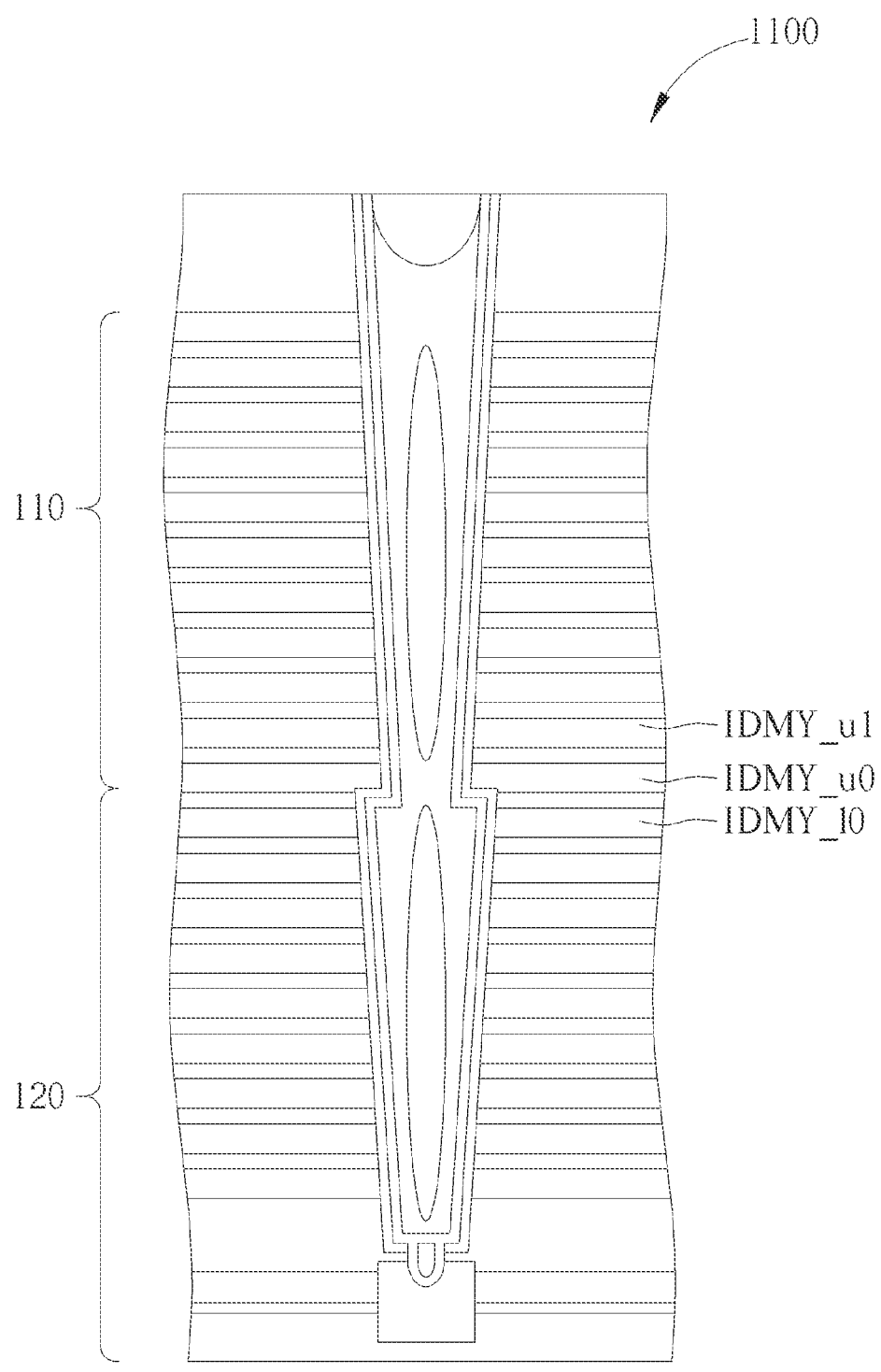
Figure 14:
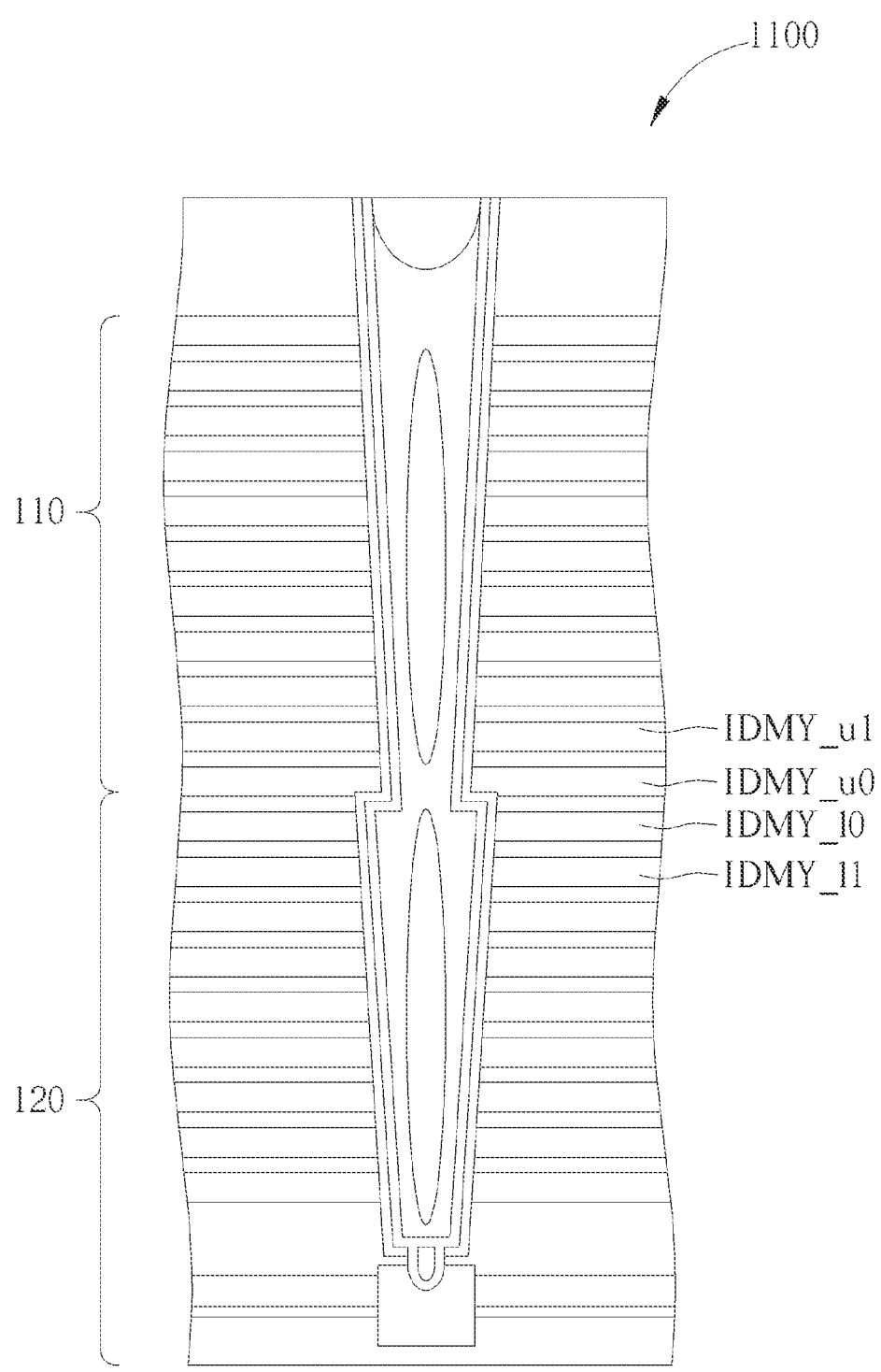

FIG. 10 is a waveform of controlling the memory 100 of FIG. 7 according to another embodiment. FIG. 10 may be similar to FIG. 9. The similarities of FIG. 10 and FIG. 9 are not described repeatedly.

As FIG. 9, in FIG. 10, a pre-pulse operation may be performed before a program operation.

During the pre-pulse operation, the first upper bias voltage V_u0, the first lower bias voltage V_l0, the second lower bias voltage V_l1, and the second upper bias voltage V_u1 may be set to a first pre-pulse level Vp1, a second pre-pulse level Vp2, a third pre-pulse level Vp3 and a fourth pre-pulse level Vp4 respectively.

During the program operation, the first upper bias voltage V_u0, the first lower bias voltage V_l0, the second lower bias voltage V_l1, and the second upper bias voltage V_u1 may be set to a first program level Vpass1, a second program level Vpass2, a third program level Vpass3 and a fourth program level Vpass4 respectively.

In FIG. 10, each of the first pre-pulse level Vp1, the second pre-pulse level Vp2, the third pre-pulse level Vp3 and the fourth pre-pulse level Vp4 may be higher than a maximum allowable level Vt_max of the first upper threshold voltage Vt_u0, the first lower threshold voltage Vt_l0, the second lower threshold voltage Vt_l1 and the second upper threshold voltage Vt_u1.

In FIG. 10, the bias voltages V_u0, V_l0, V_l1 and V_u1 may be supplied separately for better controllability and flexibility.

The waveforms in FIG. 9 and FIG. 10 may be applied when programming a word line of the lower deck 120. When programming a word line of the upper deck 110, the bias voltages V_u0, V_l0, V_l1 and V_u1 may be 0 volts during the pre-pulse operation.

FIG. 11 to FIG. 14 illustrate a memory 1100 according to different embodiments. Like the memory 100 described above, the memory 1100 may include an upper deck 110 and a lower deck 120. However, the memory 1100 may not include the joint oxide layer 155 shown in FIG. 1. Compared with the memory 100, program disturbance may be more severe when programming the memory 1100.

FIG. 11 to FIG. 14 may be similar to FIG. 1, FIG. 3, FIG. 5 and FIG. 7 respectively.

The equations and inequalities corresponding to FIG. 1, FIG. 3, FIG. 5 and FIG. 7 described above may be respectively applied to the cases of FIG. 11 to FIG. 14 for reducing program disturbance. The equations and inequalities are not described repeatedly.

In summary, by adjusting the bias voltage(s) and the threshold voltage(s) related to dummy word lines (e.g., IDMY_u0, IDMY_l0, IDMY_l1 and IDMY_u1 mentioned above) in a three-dimensional memory, program disturbance may be reduced. According to embodiments, program disturbance occurred when programming a word line of an upper deck may be better reduced. Hence, the problem in the field may be reduced.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method for operating a memory device, the memory device comprising a first word line, a second word line, a first dummy word line, a second dummy word line, and a third dummy word line, wherein the first dummy word line, the second dummy word line, and the third dummy word line are between the first word line and the second word line, and the third dummy word line is between the first word line and the first dummy word line, the method comprising:

applying a first pass voltage to the first dummy word line in a program operation;

applying a second pass voltage to the second dummy word line in the program operation, wherein the first pass voltage is different from the second pass voltage; and applying a third pass voltage to the third dummy word line in the program operation, wherein the first pass voltage is greater than the second pass voltage, and the third pass voltage is greater than the first pass voltage and the second pass voltage.

2. The method of claim 1, wherein the memory device further comprises a Top Select Gate (TSG) line and a Bottom Select Gate (BSG) line, the first word line is between the TSG line and the first dummy word line, the second dummy word line and the second word line are between the first dummy word line and 1.

3. The method of claim 2, wherein a first voltage difference between the first pass voltage and a first threshold voltage of a first dummy cell coupled to the first dummy word line is greater than a second voltage difference between the second pass voltage and a second threshold voltage of a second dummy cell coupled to the second dummy word line.

4. The method of claim 3, wherein the first voltage difference minus the second voltage difference is more than 3 V and less than 7 V.

5. The method of claim 3, wherein the first threshold voltage of the first dummy cell is the same as the second threshold voltage of the second dummy cell.

6. The method of claim 3, wherein the first threshold voltage of the first dummy cell is different from the second threshold voltage of the second dummy cell.

7. The method of claim 3, further comprising:

applying a pre-pulse voltage to the first dummy word line and the second dummy word line in a pre-pulse operation before the program operation.

8. The method of claim 7, wherein the pre-pulse voltage is higher than the first threshold voltage of the first dummy cell and the second threshold voltage of the second dummy cell.

9. The method of claim 2, further comprising:

applying a programming voltage to the first word line in the program operation when a memory cell coupled to the first word line being programed.

10. The method of claim 1, wherein the memory device further comprises a fourth dummy word line between the second dummy word line and the second word line; and the method further comprises applying a fourth pass voltage to the fourth dummy word line in the program operation, the third pass voltage being greater than the fourth pass voltage and the second pass voltage.

11. A method for operating a memory device, the memory device comprising a first deck and a second deck, the first deck being formed over the second deck, the first deck comprising a first word line, a first dummy word line, and a third dummy word line, the second deck comprising a second word line and a second dummy word line, wherein the first dummy word line, the second dummy word line, and the third dummy word line are between the first word line and the second word line, and the third dummy word line is between the first word line and the first dummy word line, the method comprising:

applying a first pass voltage to the first dummy word line in a program operation;

applying a second pass voltage to the second dummy word line in the program operation; and applying a third pass voltage to the third dummy word line in the program operation, wherein the first pass voltage is greater than the second pass voltage, and the third pass voltage is greater than the first pass voltage and the second pass voltage.

12. The method of claim 11, wherein, wherein a first voltage difference between the first pass voltage and a first threshold voltage of a first dummy cell coupled to the first dummy word line is different from a second voltage difference between the second pass voltage and a second threshold voltage of a second dummy cell coupled to the second dummy word line, and the first voltage difference is greater than the second voltage difference.

13. The method of claim 12, wherein the first voltage difference minus the second voltage difference is more than 3 V and less than 7 V.

14. A memory device, comprising:

a memory cell array comprising:

a first word line;

a second word line;

a first dummy word line;

a second dummy word line; and a third dummy word line, wherein the first dummy word line, the second dummy word line, and the third dummy word line are between the first word line and the second word line, and the third dummy word line is between the first word line and the first dummy word line; and a control circuit coupled to the memory cell array and configured to:

apply a first pass voltage to the first dummy word line in a program operation;

apply a second pass voltage to the second dummy word line in the program operation, wherein the first pass voltage is different from the second pass voltage; and apply a third pass voltage to the third dummy word line in the program operation, wherein the first pass voltage is greater than the second pass voltage, and the third pass voltage is greater than the first pass voltage and the second pass voltage.

15. The memory device of claim 14, wherein the memory cell array further comprises a Top Select Gate (TSG) line and a Bottom Select Gate (BSG) line, the first word line is between the TSG line and the first dummy word line, and the second dummy word line and the second word line are between the first dummy word line and the BSG line.

16. The memory device of claim 14, wherein the control circuit is configured to:

apply a programming voltage to the first word line in the program operation when a memory cell coupled to the first word line being programed.

17. The memory device of claim 14, wherein the control circuit is configured to:

apply a pre-pulse voltage to the first dummy word line and the second dummy word line in a pre-pulse operation before the program operation.

18. The memory device of claim 14, further comprising a joint oxide layer between a first deck and a second deck.

19. The memory device of claim 18, wherein the first dummy word line is between the joint oxide layer and the first word line, and the second dummy word line is between the joint oxide layer and the second word line.

* * * * *